US012795869B2

(12) United States Patent
Bonpain et al.

(10) Patent No.: US 12,795,869 B2
(45) Date of Patent: Nov. 10, 2026

(54) PLUG-IN MODULE WITH HEAT-DISSIPATING INTERFACES FOR A MODULE ASSEMBLY

(71) Applicant: Robert Bosch GmbH, Stuttgart (DE)

(72) Inventors: Benedict Bonpain, Neunkirchen (DE); Florian Burger, Wendlingen (DE); Manuel Maul, Keltern (DE); Matthias Engel, Stuttgart (DE); Roland Hellwig, Vaihingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 350 days.

(21) Appl. No.: 18/546,884

(22) PCT Filed: Mar. 29, 2022

(86) PCT No.: PCT/EP2022/058256
§ 371 (c)(1),
(2) Date: Aug. 17, 2023

(87) PCT Pub. No.: WO2022/248104
PCT Pub. Date: Dec. 1, 2022

(65) Prior Publication Data

US 2024/0147674 A1 May 2, 2024

(30) Foreign Application Priority Data

May 25, 2021 (DE) .................... 10 2021 205 301.7

(51) Int. Cl.
*H05K 7/20* (2006.01)
*H10W 40/22* (2026.01)
*H10W 40/60* (2026.01)

(52) U.S. Cl.
CPC ..... *H05K 7/20854* (2013.01); *H05K 7/20409* (2013.01); *H05K 7/20454* (2013.01);
(Continued)

(58) Field of Classification Search
CPC .......... H05K 7/20409; H05K 7/20436; H05K 7/20454; H05K 7/205; H05K 7/20854; H05K 7/209; H01L 23/367; H01L 23/4006
See application file for complete search history.

(56) References Cited

U.S. PATENT DOCUMENTS 9,521,782 B2 * 12/2016 Tatta ................. H05K 7/20409
2009/0279261 A1 11/2009 Seynaeve et al.
(Continued)

FOREIGN PATENT DOCUMENTS

DE 102021202654 A1 9/2022
DE 102021203625 A1 10/2022
(Continued)

OTHER PUBLICATIONS

International Search Report for PCT/EP2022/058256, Issued Aug. 4, 2022.

*Primary Examiner* — Jayprakash N Gandhi
*Assistant Examiner* — Steven Ngo
(74) *Attorney, Agent, or Firm* — NORTON ROSE FULBRIGHT US LLP

(57) ABSTRACT

A plug-in module. The plug-in module includes a module housing, a heat-dissipating device, and an electrical component arranged on a printed circuit board. The heat-dissipating device has, on a surface facing the electrical component, an internal thermal interface to thermally couple the electrical component to the heat-dissipating device. The heat-dissipating device has, on a surface facing away from the electrical component, an external thermal interface to thermally couple at least one heat-dissipating device to an external heat sink. The external thermal interface includes a thermally conductive elastic compensating element connected to the heat-dissipating device and designed to be compressed during formation of the external thermal inter-
(Continued)

face. The plug-in module also includes a thermally conductive slidable contact element applied to the thermally conductive elastic compensating element to form a thermal contact surface of the external thermal interface to the external heat sink and compress the thermally conductive elastic compensating element.

15 Claims, 3 Drawing Sheets

(52) U.S. Cl.
CPC ............ *H05K 7/205* (2013.01); *H10W 40/22* (2026.01); *H10W 40/611* (2026.01); *H05K 7/209* (2013.01)

(56) References Cited

U.S. PATENT DOCUMENTS

| | | | | |
|---|---|---|---|---|
| 2013/0208425 | A1* | 8/2013 | Lippok | H05K 7/20854 361/752 |
| 2013/0329367 | A1* | 12/2013 | Huang | H05K 7/20445 361/704 |
| 2020/0337175 | A1* | 10/2020 | Krivonak | H05K 7/18 |
| 2021/0068304 | A1 | 3/2021 | Strader et al. | |

FOREIGN PATENT DOCUMENTS

| | | | |
|---|---|---|---|
| JP | H022888 | U | 1/1990 |
| JP | 2007216823 | A | 8/2007 |
| WO | 2021010874 | A1 | 1/2021 |

* cited by examiner

PLUG-IN MODULE WITH HEAT-DISSIPATING INTERFACES FOR A MODULE ASSEMBLY

FIELD

The present invention relates to a plug-in module, in particular for a module assembly in a vehicle. In addition, the present invention relates to a module assembly, in particular for a vehicle, having at least one such plug-in module, and to a method for producing an external thermal interface of such a plug-in module.

BACKGROUND INFORMATION

Various heat dissipation technologies are described in the related art for operating electrical assemblies or modules, such as control devices, power output stages, etc., or individual electrical components, such as power semiconductors, processors, microcontrollers, etc., within a prespecified temperature range. The thermal connection of the components as heat sources to a heat sink, such as a cooling device, has a great influence here.

German Patent Application No. DE 10 2021 202 654 A1, for example, describes a heat-dissipating device, in particular for a control device arrangement in a vehicle, which has a receiving space which is open on at least one side and at least one mosaic segment arranged in the receiving space, which segment comprises a thermally conductive and elastic compensating element and a thermally conductive low-adhesion contact region. The at least one mosaic segment is arranged in the receiving space in such a way that the thermally conductive and elastic compensating element of the at least one mosaic segment abuts an inner surface of a base of the receiving space and at least the thermally conductive low-adhesion contact region of the at least one mosaic segment projects partially from the receiving space at an open side of the receiving space which is opposite the base. Here, an outer surface of the base of the receiving space forms a fixed first contact surface for a heat source or for a heat sink, and the thermally conductive low-adhesion contact region of the at least one mosaic segment forms a flexible second contact surface for the heat sink or for the heat source.

In addition, an electronic module of a motor vehicle is described in German Patent Application No. DE 10 2021 203 625 A1 which comprises at least one electronics unit with at least one electronic component and at least a housing with which the electronics unit with the electronic component is surrounded. The electronic component is in thermally conductive connection with the housing. In this case, for the heat dissipation of the electronic component at least one heat dissipation element or a component with high thermal conductivity is arranged outside the housing. In addition, German Patent Application No. DE 10 2021 203 625 A1 describes a device for accommodating replaceable electronic modules, comprising at least one housing made of a thermally conductive material, which at least partially encloses the replaceable electronic modules. In addition, a front side that is detachably connected to the housing is provided, via which access to the replaceable electronic modules arranged inside the housing is possible. For cooling the replaceable electronic modules, at least one heat exchanger is arranged on at least one outer side of the housing. A rear housing cover comprises at least one lead-through for at least one plug and/or at least one shield and/or at least one receptacle for a rear-wall circuit board which is aligned parallel to the housing cover and serves for contacting the replaceable electronic modules.

SUMMARY

A plug-in module with features of the present invention and a module assembly with features of the present invention each has the advantage that larger connecting surfaces to an external heat sink are possible due to at least one external thermal interface. As a result, a higher heat dissipation capacity can be implemented. Alternatively, with the same heat dissipation capacity the contact area required for heat dissipation can be reduced. In addition, unevennesses between a heat-dissipating device and the external heat sink can be compensated by at least one thermally conductive elastic compensating element of the at least one external thermal interface. As a result of the improved heat transfer, the service life of the electrical components as heat sources can be extended. By means of at least one thermally conductive slidable contact element of the at least one external thermal interface, the latter can simply be lifted again off the corresponding contact surface of the heat sink without parts of the at least one thermally conductive elastic compensating element remaining on the contact surface of the heat sink. In addition, broader tolerances in the contact surfaces of the heat-dissipating device and of the external heat sink can be accepted due to the at least one thermally conductive elastic compensating element. As a result, production costs can be further reduced.

Example embodiments of the present invention provide a plug-in module, in particular for a module assembly in a vehicle, comprising a module housing, at least one heat-dissipating device and at least one electrical component arranged on a printed circuit board. The module housing at least partially surrounds the circuit board. The at least one heat-dissipating device has, on a surface facing the at least one electrical component, at least one internal thermal interface, which is designed to thermally couple the at least one electrical component to the at least one heat-dissipating device. In addition, the at least one heat-dissipating device has at least one external thermal interface on a surface facing away from the at least one electrical component, which interface is designed to thermally couple the at least one heat-dissipating device to an external heat sink. In this case, the at least one external thermal interface comprises at least one thermally conductive elastic compensating element, which is connected to the at least one heat-dissipating device and is designed to be compressed during the formation of the corresponding external thermal interface, and at least one thermally conductive slidable contact element, which is applied to the at least one thermally conductive elastic compensating element and is designed to form a thermal contact surface of the external thermal interface to the external heat sink and compress the at least one thermally conductive elastic compensating element.

In addition, according to an example embodiment of the present invention, a module assembly, in particular for a vehicle, is provided, comprising a housing, in which a rear-wall circuit board, at least one external heat sink and at least one slot are arranged, and comprising at least one such plug-in module. Here, the at least one plug-in module is inserted at a corresponding slot in a corresponding receiving opening in the housing in such a way that the plug-in module is held in a form-fitting and force-fitting manner between a first contact surface and a second contact surface of the receiving opening, wherein the at least one thermally conductive elastic compensating element compressed by the insertion movement together with the at least one thermally conductive slidable contact element form the at least one external thermal interface to the at least one external heat sink, so that the heat generated by the at least one electrical component of the plug-in module can be dissipated directly into the at least one external heat sink via the at least one internal thermal interface and the at least one heat-dissipating device and the at least one external thermal interface.

Furthermore, according to an example embodiment of the present invention, a method for producing an external thermal interface of such a plug-in module is provided, which comprises the steps of: providing the plug-in module, applying the at least one thermally conductive elastic compensating element to the surface of the at least one heat-dissipating device that faces away from the at least one electrical component, connecting the first end region of the at least one thermally conductive slidable contact element that is at the front in the insertion direction to the at least one heat-dissipating device and applying the at least one thermally conductive slidable contact element to the at least one thermally conductive elastic compensating element.

Embodiments of the external thermal interface make it possible to compensate for unevenness tolerances in relation to an external heat sink and to absorb a good heat transfer even in the case of unevennesses in the surfaces and in the case of particles between the surfaces, doing so without a permanent air gap being created between the heat-dissipating device and the external heat sink.

In the following, a plug-in module can be understood to mean an electronic module which, in particular, executes computationally-intensive functions in the motor vehicle field and can be used, for example, for partially autonomous or autonomous driving functions, communication functions, gateway functionalities, infotainment functions, safety functions, and so on. The associated electrical components include high-performance processors, multi-core processors or highly integrated circuits (SoC, system-on-chip) or power semiconductors that are characterized by high power losses. The embodiment as a plug-in module enables an easy exchangeability in the corresponding module assembly and also permits subsequent retrofitting of current hardware by enabling electronic assemblies to be replaced or inserted accordingly.

In the following, a heat-dissipating device is understood to mean a component with particularly good thermal conductivity, which can be designed, for example, as a die-cast component, in particular an aluminum die-cast component, or as an extruded part or sheet metal part.

As a result of the measures and developments disclosed herein, advantageous improvements of the plug-in module and of the module assembly, in particular for a vehicle, are possible.

According to an example embodiment of the present invention, it is particularly advantageous that the at least one external thermal interface can be arranged in a receiving space of the at least one heat-dissipating device, wherein the at least one thermally conductive slidable contact element can entirely project and the at least one thermally conductive elastic compensating element can at least partially project from the receiving space. As a result, a depth of the receiving space can represent a maximum range beyond which the at least one thermally conductive elastic compensating element cannot be further compressed.

In an advantageous embodiment of the plug-in module of the present invention, the at least one thermally conductive elastic compensating element can be non-detachably connected to the at least one heat-dissipating device. Preferably, the at least one thermally conductive elastic compensating element can be connected to the heat-dissipating device by gluing. Alternatively, other suitable connecting techniques can also be used.

In a further advantageous embodiment of the plug-in module of the present invention, the at least one thermally conductive elastic compensating element can be designed as a gap filler. For example, a commercially available silicone-based, self-adhesive and highly thermally conductive mat with a thickness of 1.52 mm can be used as a thermally conductive elastic compensating element. As a result, unevennesses within a range of approximately ±0.2 mm can be compensated, for example. The at least one thermally conductive elastic compensating element can be designed, for example, as a flat mat or as a strip.

In a further advantageous embodiment of the plug-in module of the present invention, the at least one thermally conductive slidable contact element can be designed as a strip or plate. The at least one thermally conductive slidable contact element consists of a very thin, tear-resistant and robust material, which, however, does not have to be specially processed for this purpose. For example brass, copper, aluminum, carbon (carbon fibers), graphite or even spring steel can be used as the material. The at least one thermally conductive slidable contact element can be present, for example, as a very thin metal sheet or as a carbon fiber mat with a thickness of approximately 0.02 mm to 0.1 mm. In order to increase compensation for unevennesses and particles, a plurality of strips of thermally conductive slidable contact elements can also be applied as an alternative to a large-area thermally conductive slidable contact element. The strips can be produced, for example, as punched or laser-cut parts and, for example, have a width between 5 and 20 mm. This results in a high degree of geometric freedom, so that the strips can be easily adapted to requirements in their geometry and material selection and areal proportion of an entire cooling surface. Since the at least one thermally conductive elastic compensating element is largely covered by the individual strips or the plate, the at least one thermally conductive slidable contact element can easily be removed from a contact surface of the heat sink. In this case, due to the compressible at least one thermally conductive elastic compensating element, the external thermal interface can adapt to surface unevennesses. In this way, even uneven joined surfaces can be contacted over a large area and thus have a good heat transfer. Furthermore, a high degree of robustness against contamination can result, since individual dirt particles in the air gap between the individual strips of the thermally conductive slidable contact elements can only prevent the abutment of a single strip. A good heat transfer of all of the other strips is thus also ensured. Intermediate spaces between the strips can serve as "volume buffers." In the case of particles or local unevennesses, these spaces can serve, for example, as volume compensation for an adhesive medium which holds the strips on the at least one thermally conductive elastic compensating element.

In addition, however, further approaches to solutions are also possible, such as holes in the at least one thermally conductive slidable contact element, which allow the at least one thermally conductive elastic compensating element to come into direct contact with the heat sink. Ideally, so as not to impede the assembly process, it is only after the said process that the material presses through the openings or does not become effective until a film is pulled off. With this principle, a further transfer resistance is partially avoided. However, this method is only useful when the thermal resistance of the material of the at least one thermally conductive elastic compensating element is lower than the sum of the thermal resistance of the at least one thermally conductive slidable contact element and of the transfer resistance.

In a further advantageous embodiment of the plug-in module of the present invention, the at least one thermally conductive slidable contact element can be connected to the at least one heat-dissipating device at a first end region that is at the front in the insertion direction. This advantageously prevents the at least one thermally conductive slidable contact element from detaching from the at least one thermally conductive elastic compensating element when the plug-in module is being inserted. This means that frictional forces can be absorbed by a first connection at the first end region when the plug-in module is being inserted. Alternatively, the at least one thermally conductive slidable contact element can be connected at both end regions to the at least one heat-dissipating device. By means of an additional second connection at a second end region, frictional forces can be absorbed when the plug-in module is being pulled out. Laser welding can preferably be used as a connection technique. Of course, other suitable connecting methods, such as welding, toxing, riveting, screwing, clamping or soldering, are also possible, which in turn depend on the material pairing.

In an advantageous embodiment of the module assembly of the present invention, the at least one heat sink can be designed as a cooling device. In this case, the at least one receiving opening can be formed in the cooling device.

In a further advantageous embodiment of the module assembly of the present invention, the at least one cooling device can comprise a plurality of cooling elements, wherein at least one cooling element can be arranged between two receiving openings arranged adjacent to one another. In addition, the at least one cooling element can be designed, for example, as a metal plate into which at least one cooling channel has been incorporated. By way of example, water or another suitable coolant can be conducted through the at least one cooling channel in order to enable dissipation of the heat generated by the at least one electrical component. Alternatively, the cooling element can, for example, also be designed as a so-called vapor chamber, heat pipe, pulsating heat pipe.

In an advantageous embodiment of the module assembly of the present invention, the plug-in module can have at least one plug which, in the inserted state, can be plugged into a corresponding plug receptacle in the rear-wall circuit board.

The assembly principle of the module assembly according to the present invention is that a plug-in module, such as a drawer, can be inserted into an associated receiving opening at the corresponding slot. Here, the plug-in module is inserted into the receiving opening until the at least one plug of the plug-in module is plugged into the corresponding plug receptacle in the rear-wall circuit board. During the insertion process of the plug-in module, the pushing force applied creates a compression force which acts perpendicularly to the sliding direction and compresses the at least one thermally conductive elastic compensating element of the at least one external thermal interface. Of course, the force required to insert the plug-in module into the receiving opening should be as low as possible, and thus the friction partners should be designed accordingly.

Exemplary embodiments of the present invention are illustrated in the figures and explained in more detail in the following description. In the figures, identical reference signs denote components or elements which perform the same or analogous functions.

DETAILED DESCRIPTION OF EXAMPLE EMBODIMENTS

Figure 1:
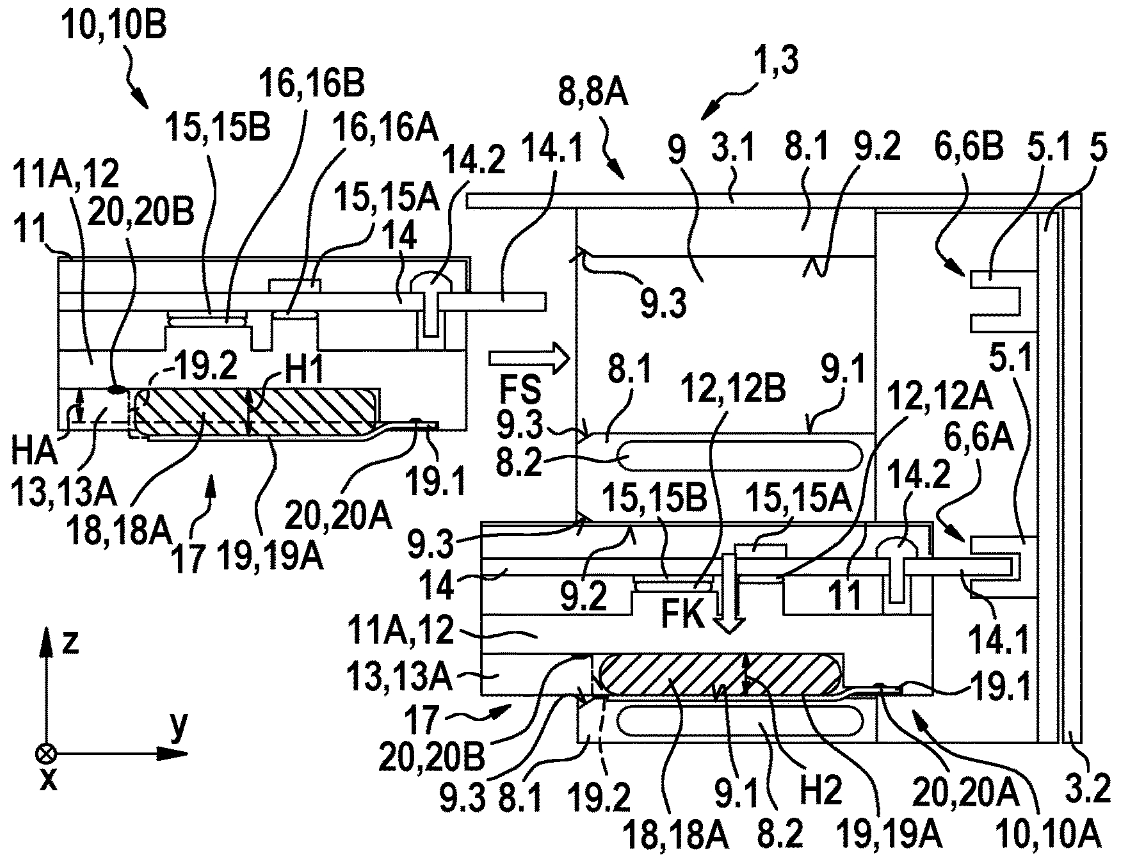
FIG. 1 is a schematic sectional view of a detail of an embodiment of a module assembly according to an example embodiment of the present invention, in particular for a vehicle, with exemplary embodiments of a plug-in module according to the present invention.

As can be seen from FIG. 1, the exemplary embodiment shown of a module assembly 1 according to the present invention, in particular for a vehicle, comprises a housing 3, in which a rear-wall circuit board 5, at least one heat sink 8 and at least one slot 6 are arranged, and at least one plug-in module 10, which is inserted into a corresponding receiving opening 9 in the housing 3 at a corresponding slot 6 in such a way that the plug-in module 10 is held in a form-fitting and force-fitting manner between a first contact surface 9.1 and a second contact surface 9.2 of the receiving opening 9. Here, at least one thermally conductive elastic compensating element 18 compressed by the insertion movement and having at least one thermally conductive slidable contact element 19 forms the at least one external thermal interface 17 to the at least one external heat sink 8, so that the heat generated by at least one electrical component 15 of the at least one plug-in module 10 can be dissipated directly into the at least one external heat sink 8 via at least one internal thermal interface 16 and at least one heat-dissipating device 12 and the at least one external thermal interface 17.

The section of the module assembly 1 shown in FIG. 1 shows two slots 6A, 6B, into which a plug-in module 10 can be inserted. In addition, FIG. 1 shows two plug-in modules 10, wherein a first plug-in module 10A has already been inserted at its provided slot 6A and a second plug-in module 10B is being inserted into its intended slot 6B.

As can also be seen from FIG. 1, the plug-in modules 10, 10A, 10B shown comprise in each case a module housing 11, at least one heat-dissipating device 12 and at least one electrical component 15 arranged on a printed circuit board 14, wherein the module housing 11 at least partially surrounds the printed circuit board 14. The at least one heat-dissipating device 12 has, on a surface facing the at least one electrical component 15, at least one internal thermal interface 16, thermally couples the at least one electrical component 15 to the at least one heat-dissipating device 12. In addition, the at least one heat-dissipating device 12 has, on a surface facing away from the at least one electrical component 15, at least one external thermal interface 17, which thermally couples the at least one heat-dissipating device 12 to an external heat sink 8. Here, the at least one external thermal interface 17 comprises at least one thermally conductive elastic compensating element 18, which is connected to the at least one heat-dissipating device 12 and is compressible during the formation of the corresponding external thermal interface 17, and at least one thermally conductive slidable contact element 19, which is applied to the at least one thermally conductive elastic compensating element 18 and forms a thermal contact surface of the external thermal interface 17 to the external heat sink 8 and which compresses the at least one thermally conductive elastic compensating element 18.

As can also be seen from FIG. 1, the plug-in modules 10A, 10B in the illustrated exemplary embodiment of the module assembly 1 comprise in each case only one heat-dissipating device 12, which simultaneously forms a housing base 11A of the housing 11. In the illustrated section of the plug-in module 10A, 10B, two electrical components 15 in each case are arranged on the printed circuit board 14, which is mechanically connected to the heat-dissipating device 12 via at least one fastening element 14.2. Here, a first electrical component 15 is designed as a power semiconductor 15A, which is connected to the heat-dissipating device 12 via a first internal thermal interface 16A. A second electrical component 15 is designed as a power processor 15B, which is connected to the heat-dissipating device 12 via a second internal thermal interface 16B. Alternatively, the circuit board 14 can also be arranged and held between two parts of the housing 11, in the manner of a sandwich. The internal thermal interfaces 16, 16A, 16B can consist, for example, of thermally conductive materials, which are also referred to as thermal interface materials (TIM). The thermally conductive material can preferably be a thermally conductive elastomer. In addition, the heat dissipating devices 12 of the illustrated plug-in modules 10A, 10B in each case comprise only one external thermal interface 17, which is arranged in a receiving space 13 of the at least one heat-dissipating device 12. Here, the receiving space 13 is designed as a depression, wherein the at least one thermally conductive slidable contact element 19 entirely projects and the at least one thermally conductive elastic compensating element 18 at least partially projects from the receiving space 11. In the exemplary embodiment shown, the at least one thermally conductive elastic compensating element 18 is designed as a gap filler 18A and is detachably connected to heat-dissipating device 12 by means of an adhesive connection. In the exemplary embodiment shown, the gap filler 18A has a height H1 of approximately 1.52 mm in the normal state. The receiving space 13 has a height HA of approximately 0.9 mm to the bearing edge. This height HA represents a maximum range beyond which the gap filler 18A cannot be compressed. This means that a height H2 of the gap filler 18A in the compressed state can have a minimum of 0.9 mm. This results in a tolerance field which the two surfaces may have with regard to unevennesses in order for it to still be possible to join them.

Figure 2:
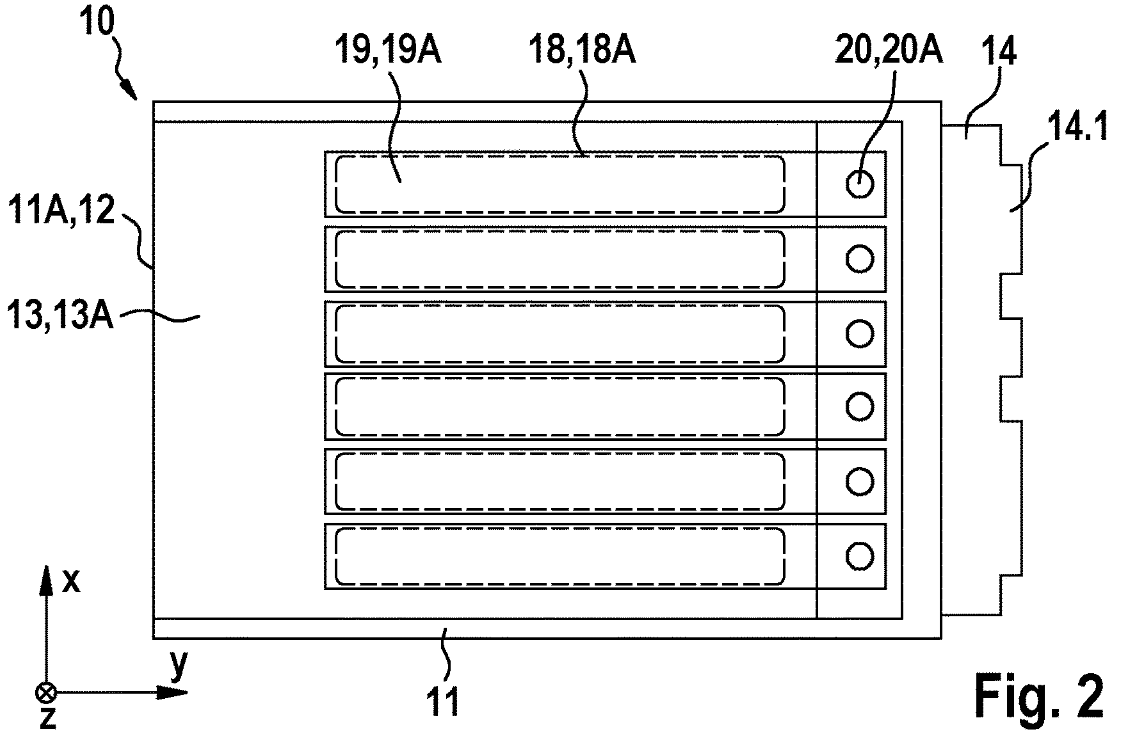
FIG. 2 is a schematic view from below of a detail of the plug-in module according to the present invention from FIG. 1.

As can also be seen from FIG. 2, in the exemplary embodiment of the module assembly 1 shown, the plug-in modules 10 in each case have six thermally conductive slidable contact elements 19 designed as strips 19A, which are in each case arranged on a thermally conductive elastic compensating element 18 designed as a strip, so that six thermally conductive slidable contact elements 19 are arranged on six thermally conductive elastic compensating elements 18.

In an alternative embodiment, not shown, the at least one thermally conductive elastic compensating element 18 is designed as a flat mat on which the six thermally conductive slidable contact elements 19 designed as strips 19A are arranged.

In a further exemplary embodiment, not shown, at least one hole is introduced into the at least one thermally conductive slidable contact element 19.

As can also be seen from FIGS. 1 and 2, the thermally conductive slidable contact elements 19 are each connected to the heat-dissipating device 12 via a first connection 20A at a first end region 19.1 that is at the front in the insertion direction. As can be further seen from FIG. 1, the thermally conductive slidable contact elements 19 can optionally also be connected to the at least one heat-dissipating device 12 at the second end 19.2 in each case via a second connection. The connections 20A, 20B are designed, for example, as laser-welded connections 20.

As can also be seen from FIG. 1, the at least one heat sink 8 is designed as a cooling device 8A with a plurality of cooling elements 8.1. In addition, the receiving openings 9 are formed in the cooling device 8A, wherein at least one cooling element 8.1 is arranged between two receiving openings 9 arranged adjacent to one another. In the exemplary embodiment shown, the cooling elements 8.1 are designed as metal plates, wherein the cooling elements 8.1 arranged between two adjacent receiving openings 9 additionally have a cooling channel 8.2 introduced into the metal plate in the illustrated exemplary embodiment. The cooling device 8A is fixedly connected to the housing 3, so that the receiving openings 9 are arranged immovably with respect to the slots 6, 6A, 6B. This means that the receiving openings 9 do not move while the plug-in modules 10, 10A, 10B are being inserted.

As can also be seen from FIGS. 1 and 2, the plug-in modules 10, 10A, 10B each have a plurality of plugs 14.1, which in the inserted state are plugged into a corresponding plug receptacle 5.1 of the rear-wall circuit board 5, as shown by the first plug-in module 10A shown in FIG. 1. The inserted or plugged-in plug-in modules 10—in this case the first plug-in module 10A—are electrically contacted via the plug receptacles 5.1 of the rear-wall circuit board 5. In addition, a plurality of inserted plug-in modules 10, 10A, 10B can be electrically connected to one another via the rear-wall circuit board 5. As can also be seen from FIG. 1, the cooling device 8A is arranged in the housing 3 in such a way that an end region of the inserted plug-in module 10A on which the plugs 14.1 are arranged is held in the receiving opening 9 in a force-fitting and form-fitting manner. In addition to a cover 3.1 (shown) and an illustrated rear wall 3.2, the housing 3 also comprises side walls (not shown in more detail) and a bottom (not shown).

The assembly principle of the module assembly 1 is that the plug-in modules 10A, 10B can be inserted in the longitudinal direction y into the housing 3 like drawers and without the use of tools. As can also be seen from FIG. 1, the second plug-in module 10B shown, when being inserted, is pre-centered by means of small insertion bevels 9.3 on the receiving opening 9 with an intended clearance of, for example, approximately 0.6 mm. This means that the housing 11 and the thermally conductive slidable contact elements 19 of the second plug-in module 10 touch the insertion bevels 9.3 after a short insertion movement of approximately 10 mm, for example, and thus center the second plug-in module 10B in the vertical direction z, by the subsequent thermally conductive elastic compensating elements 18 starting with an oversize of, for example, approximately 0.3 mm in order to press the second plug-in module 10B against the second contact surface 9.2. After completion of the centering process, the actual sliding of the thermally conductive slidable contact elements 19 begins. Here, the applied thrust FS in the longitudinal direction y creates a compression force FK acting in the vertical direction z, which compresses the thermally conductive elastic compensating elements 18 via the thermally conductive slidable contact elements 19. The second plug-in module 10 now slides over the first contact surface 9.1 of the heat sink 8 and over the second contact surface 9.2 in the direction of the plug receptacle 5.1 of the rear-wall circuit board 5. The plug receptacle 5.1 is in turn designed or positioned on the rear-wall circuit board 5 and matched to the second contact surface 9.2 in such a way that no deformation of the circuit board 14 or of the plugs 14.1 or of the plug receptacle 5.1 results. Once the end position is reached, an electrical connection is created between the rear-wall circuit board 5 and the second plug-in module 10B. This compression force FK maintained by the compression by 0.3 mm of the thermally conductive elastic compensating elements acts on the inserted first plug-in module 10A in such a way that the external thermal interface 17 creates a good thermal transition between the heat-dissipating device 12 and the heat sink 8.

In the illustrated exemplary embodiment of the module assembly 1, a thermal path between the inserted first plug-in module 10A and the corresponding cooling element 8.1 together with the cooling channel comprises a transfer resistance of the glued-on gap filler 18A, which can be influenced by the production of the external thermal interface 17, a heat conduction in the gap filler 18A, which can be determined by the material selection, a heat transfer to the thermally conductive slidable contact element 19, which can be influenced by the production of the external thermal interface 17, a heat conduction in the thermally conductive slidable contact element 19, which can be influenced by the selection of a material but which has an effect on the friction value, and a heat transfer from the thermally conductive slidable contact element 19 to the cooling element 8.1, which can be positively influenced by the compensation of tolerances and unevennesses.

By combining the elastic compensating element 18 with the slidable contact elements, which have a low coefficient of sliding friction in the range of 0.1 to 0.3, a larger contact area for the heat transfer can be generated by the good tolerance compensation.

Figure 3:
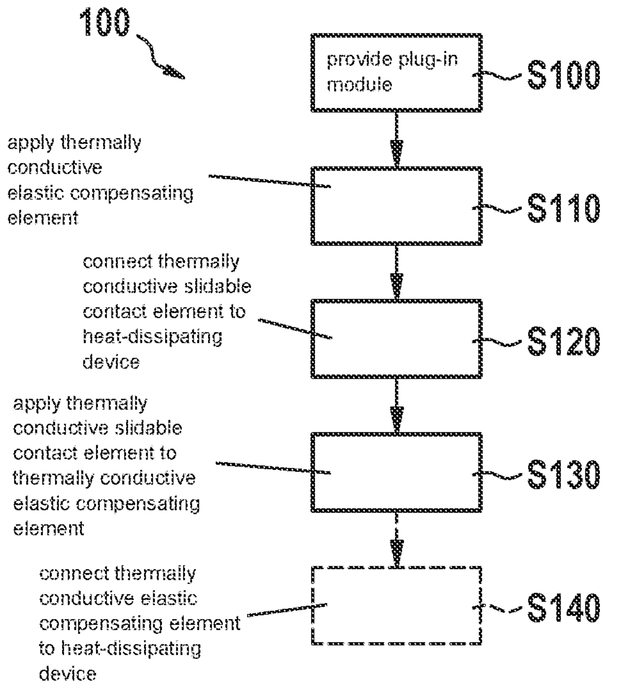
FIG. 3 shows a schematic flowchart of an exemplary embodiment of a method according to the present invention for producing an external thermal interface of the plug-in module from FIGS. 1 and 2.
Figure 4:
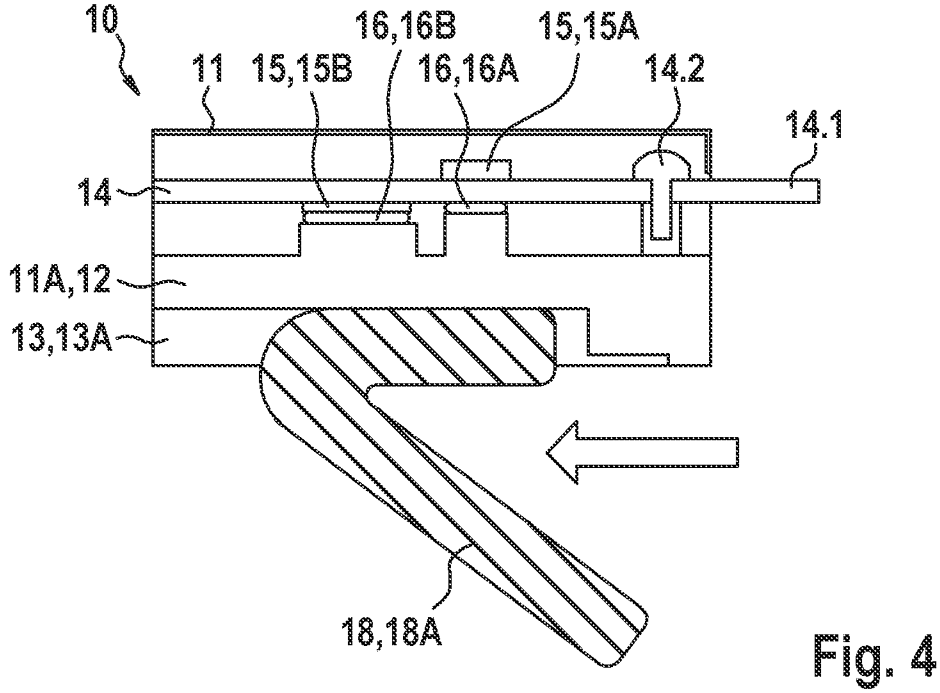
FIGS. 4 to 6 in each case show a schematic sectional illustration of a detail of the plug-in module according to the present invention from FIGS. 1 and 2 during the execution of the method according to the present invention from FIG. 3.
Figure 5:
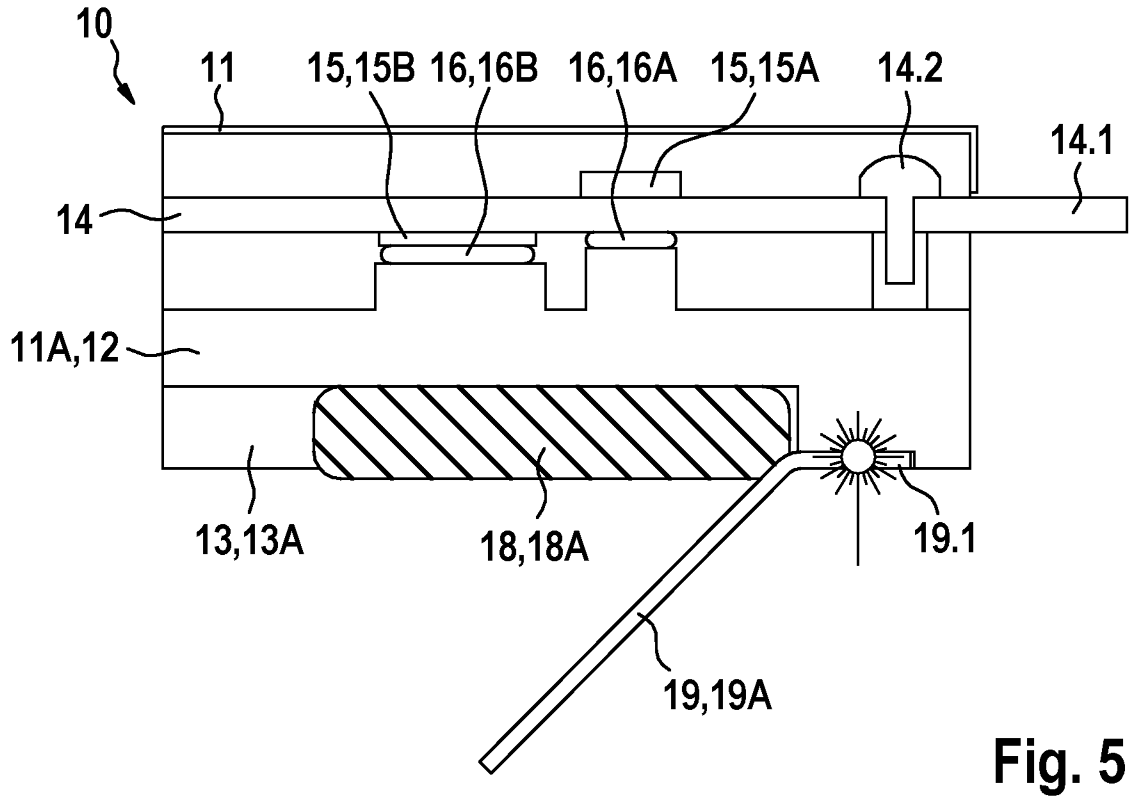
Figure 6:
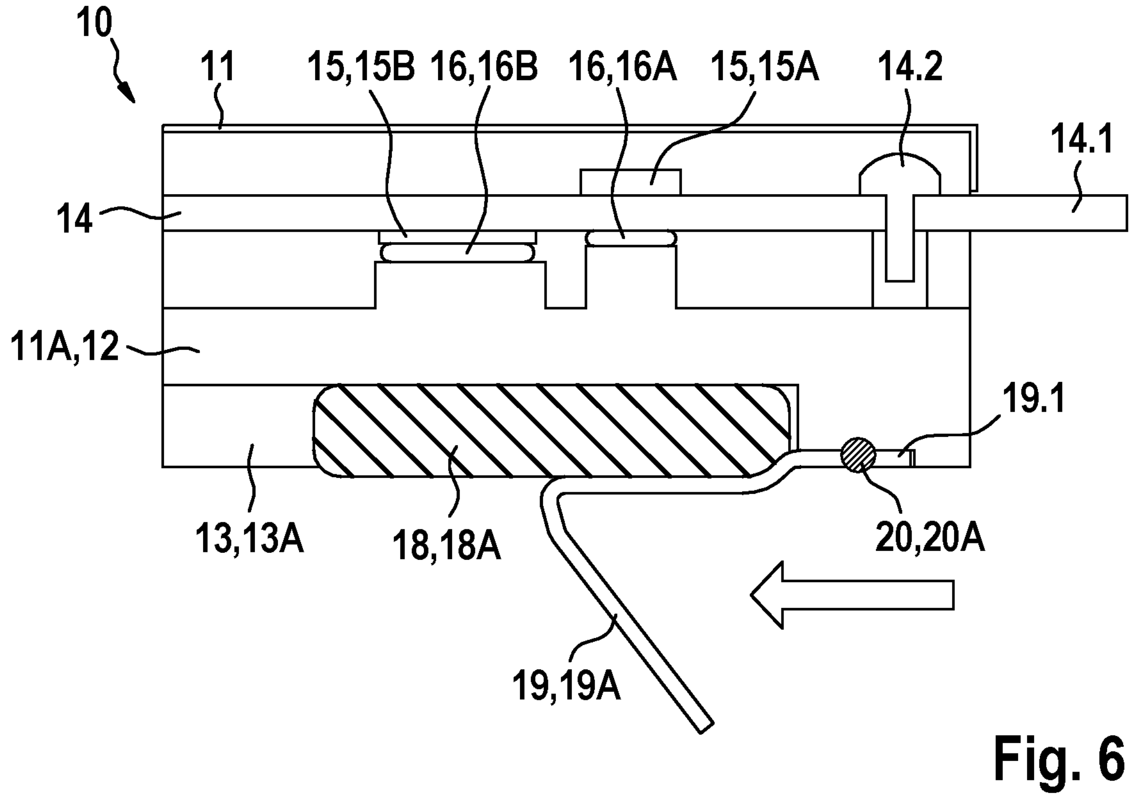

As can also be seen from FIG. 3, the method 100 according to the present invention for producing an external thermal interface 17 of a plug-in module 10 comprises a step S100, which provides a plug-in module 10. In a step S110, the at least one thermally conductive elastic compensating element 18 is applied to the surface of the at least one heat-dissipating device 12 that faces away from the at least one electrical component 15. As can also be seen from FIG. 4, the at least one thermally conductive elastic compensating element 18 in the exemplary embodiment shown is applied to the heat-dissipating device 12 via a shearing movement and glued, whereby air inclusions are prevented. In a step S120, a first end region 19.1 of the at least one thermally conductive slidable contact element 19 that is at the front in the insertion direction is connected to the at least one heat-dissipating device 12. As can also be seen from FIG. 5, the front first end region 19.1 of the at least one thermally conductive slidable contact element 19 in the exemplary embodiment shown is connected to the at least one heat-dissipating device 12 by means of laser welding. Following this, in step S130, the at least one thermally conductive slidable contact element 19 is applied to the at least one thermally conductive elastic compensating element 18. As can also be seen from FIG. 6, the at least one thermally conductive slidable contact element 19 is applied to the at least one thermally conductive elastic compensating element 18 by means of a shearing movement and glued thereto, whereby air inclusions are prevented.

Optionally, in step S140 (shown in dashed lines) the second end region 19.2 of the at least one thermally conductive slidable contact element 19 can also be connected to the heat-dissipating device 12.

What is claimed is:

1. A plug-in module for a module assembly in a vehicle, comprising:

a module housing;

at least one heat-dissipating device; and at least one electrical component arranged on a printed circuit board, wherein the module housing at least partially surrounds the printed circuit board, wherein the at least one heat-dissipating device has, on a surface facing the at least one electrical component, at least one internal thermal interface, which is configured to thermally couple the at least one electrical component to the at least one heat-dissipating device, wherein the at least one heat-dissipating device has, on a surface facing away from the at least one electrical component, at least one external thermal interface which is configured to thermally couple the at least one heat-dissipating device to an external heat sink, wherein the at least one external thermal interface includes at least one thermally conductive elastic compensating element, which is connected to the at least one heat-dissipating device and is configured to be compressed during formation of the at least one external thermal interface, and at least one thermally conductive slidable contact element, which is applied to the at least one thermally conductive elastic compensating element and is configured to form a thermal contact surface of the at least one external thermal interface to the external heat sink and compress the at least one thermally conductive elastic compensating element, wherein the plug-in module is configured to be inserted into a corresponding receiving opening of a module assembly, the receiving opening having a first contact surface and a second contact surface and at least one insertion bevel configured to pre-center the plug-in module during insertion, such that the plug-in module is guided into alignment with the first and second contact surfaces before compression of the thermally conductive elastic compensating element occurs.

2. The plug-in module according to claim 1, wherein the at least one external thermal interface is arranged in a receiving space of the at least one heat-dissipating device, wherein the at least one thermally conductive slidable contact element entirely projects from the receiving space and the at least one thermally conductive elastic compensating element partially projects from the receiving space.

3. The plug-in module according to claim 1, wherein the at least one thermally conductive elastic compensating element is non-detachably connected to the at least one heat-dissipating device.

4. The plug-in module according to claim 1, wherein the at least one thermally conductive elastic compensating element is configured as a gap filler.

5. The plug-in module according to claim 1, wherein the at least one thermally conductive slidable contact element is a strip or plate.

6. The plug-in module according to claim 5, wherein at least one hole is introduced into the at least one thermally conductive slidable contact element.

7. The plug-in module according to claim 1, wherein the at least one thermally conductive slidable contact element is connected to the at least one heat-dissipating device at a first end region that is at a front in an insertion direction.

8. The plug-in module according to claim 7, wherein the at least one thermally conductive slidable contact element is connected to the at least one heat-dissipating device at both end regions.

9. A module assembly for a vehicle, comprising:

a housing, in which a rear-wall circuit board, at least one external heat sink and at least one slot are arranged; and at least one plug-in module, including:

a module housing, at least one heat-dissipating device, and at least one electrical component arranged on a printed circuit board, wherein the module housing at least partially surrounds the printed circuit board, wherein the at least one heat-dissipating device has, on a surface facing the at least one electrical component, at least one internal thermal interface, which is configured to thermally couple the at least one electrical component to the at least one heat-dissipating device, wherein the at least one heat-dissipating device has, on a surface facing away from the at least one electrical component, at least one external thermal interface which is configured to thermally couple the at least one heat-dissipating device to an external heat sink, wherein the at least one external thermal interface includes at least one thermally conductive elastic compensating element, which is connected to the at least one heat-dissipating device and is configured to be compressed during formation of the at least one external thermal interface, and at least one thermally conductive slidable contact element, which is applied to the at least one thermally conductive elastic compensating element and is configured to form a thermal contact surface of the at least one external thermal interface to the external heat sink and compress the at least one thermally conductive elastic compensating element, wherein the plug-in module is configured to be inserted into a corresponding receiving opening of a module assembly, the receiving opening having a first contact surface and a second contact surface and at least one insertion bevel configured to pre-center the plug-in module during insertion, such that the plug-in module is guided into alignment with the first and second contact surfaces before compression of the thermally conductive elastic compensating element occurs;

wherein the at least one plug-in module is inserted at a corresponding slot into the corresponding receiving opening of the housing in such a way that the at least one plug-in module is held in a form-fitting and force-fitting manner between a first contact surface and a second contact surface of the corresponding receiving opening, wherein the at least one thermally conductive elastic compensating element compressed by an insertion movement together with the at least one thermally conductive slidable contact element form the at least one external thermal interface to the at least one external heat sink, so that the heat generated by the at least one electrical component of the at least one plug-in module can be dissipated directly into the at least one external heat sink via the at least one internal thermal interface and the at least one heat-dissipating device and the at least one external thermal interface.

10. The module assembly according to claim 9, wherein the at least one external heat sink is a cooling device.

11. The module assembly according to claim 10, wherein the corresponding receiving opening is formed in the cooling device.

12. The module assembly according to claim 9, wherein the at least one external heat sink is at least one cooling device and the at least one cooling device has a plurality of cooling elements, wherein the corresponding opening comprises a plurality of corresponding openings, wherein at least one of the plurality of cooling elements is arranged between two of the plurality of corresponding openings arranged adjacent to one another.

13. The module assembly according to claim 12, wherein the at least one of the plurality of cooling element is a metal plate into which at least one cooling channel is introduced.

14. The module assembly according to claim 9, wherein the at least one plug-in module has at least one plug which, in an inserted state, is plugged into a corresponding plug receptacle of the rear-wall circuit board.

15. A method for producing an external thermal interface of a plug-in module, the plug-in module including:

a module housing;

at least one heat-dissipating device; and at least one electrical component arranged on a printed circuit board, wherein the module housing at least partially surrounds the printed circuit board, wherein the at least one heat-dissipating device has, on a surface facing the at least one electrical component, at least one internal thermal interface, which is configured to thermally couple the at least one electrical component to the at least one heat-dissipating device, wherein the at least one heat-dissipating device has, on a surface facing away from the at least one electrical component, at least one external thermal interface which is configured to thermally couple the at least one heat-dissipating device to an external heat sink, wherein the at least one external thermal interface includes at least one thermally conductive elastic compensating element, which is connected to the at least one heat-dissipating device and is configured to be compressed during formation of the at least one external thermal interface, and at least one thermally conductive slidable contact element, which is applied to the at least one thermally conductive elastic compensating element and is configured to form a thermal contact surface of the at least one external thermal interface to the external heat sink and compress the at least one thermally conductive elastic compensating element, wherein the plug-in module is configured to be inserted into a corresponding receiving opening of a module assembly, the receiving opening having a first contact surface and a second contact surface and at least one insertion bevel configured to pre-center the plug-in module during insertion, such that the plug-in module is guided into alignment with the first and second contact surfaces before compression of the thermally conductive elastic compensating element occurs, the method comprising the following steps:

providing the plug-in module;

applying the at least one thermally conductive elastic compensating element to the surface of the at least one heat-dissipating device that faces away from the at least one electrical component;

connecting a first end region of the at least one thermally conductive slidable contact element that is at a front in an insertion direction to the at least one heat-dissipating device; and applying the at least one thermally conductive slidable contact element to the at least one thermally conductive elastic compensating element.

* * * * *